United States Patent [19]
Yasunaga et al.

[11] Patent Number: 5,018,003
[45] Date of Patent: May 21, 1991

[54] LEAD FRAME AND SEMICONDUCTOR DEVICE

[75] Inventors: Masatoshi Yasunaga; Masanobu Kohara, both of Itami, Japan

[73] Assignee: Mitsubishi Denki Kabushiki Kaisha, Japan

[21] Appl. No.: 571,842

[22] Filed: Aug. 21, 1990

Related U.S. Application Data

[63] Continuation of Ser. No. 330,212, Mar. 29, 1989, abandoned.

[30] Foreign Application Priority Data

Oct. 20, 1988 [JP] Japan ................................ 63-265473

[51] Int. Cl.⁵ ...................... H01L 23/50; H01L 21/56
[52] U.S. Cl. ..................... 357/72; 437/224; 437/211; 437/215
[58] Field of Search ............................ 357/70, 72

[56] References Cited

U.S. PATENT DOCUMENTS 4,788,583 11/1988 Kawahara et al. ................ 357/72

FOREIGN PATENT DOCUMENTS

| 0152970 | 12/1979 | Japan . | |
|---|---|---|---|
| 60-9131 | 1/1985 | Japan | 437/207 |
| 60-63122 | 4/1985 | Japan . | |
| 60-180127 | 9/1985 | Japan | 437/220 |
| 61-13636 | 1/1986 | Japan | 437/211 |
| 0053752 | 3/1986 | Japan . | |
| 61-193460 | 8/1986 | Japan | 437/219 |
| 62-188143 | 11/1987 | Japan . | |
| 0228655 | 9/1988 | Japan | 357/70 |

Primary Examiner—Andrew J. James
Assistant Examiner—Viet Q. Nguyen
Attorney, Agent, or Firm—Leydig, Voit & Mayer

[57] ABSTRACT

A lead frame includes a die pad for mounting thereon a semiconductor chip having a plurality of electrodes, a plurality of leads for electrical connection with the plurality of electrodes of the semiconductor chip, an outer frame disposed on the periphery of the die pad for supporting the die pad and the plurality of leads, and a resin guide portion extending to the vicinity of the die pad from the outer frame for guiding molten resin over and under the semiconductor chip during resin packaging. A semiconductor device manufacturing method includes mounting a semiconductor chip having electrodes on a substrate having a resin guiding portion for guiding a resin over and under the semiconductor chip during resin packaging; electrically connecting leads on the substrate to the electrodes; positioning the semiconductor chip and the substrate between a pair of mold halves injecting a molten resin into the mold to fill the cavity; and solidifying the resin.

2 Claims, 4 Drawing Sheets

LEAD FRAME AND SEMICONDUCTOR DEVICE

This application is a continuation of application Ser. No. 07/330,212, filed Mar. 29, 1989 now abandoned.

BACKGROUND OF THE INVENTION

1. Field of the Invention:

The present invention relates to a lead frame by which a highly reliable semiconductor device is provided. The present invention also relates to a semiconductor device in which a semiconductor chip is packaged with a resin, as well as a manufacturing method therefor.

2. Description of the Related Art:

FIG. 1 is a plan view illustrating the relationship between a die and a lead frame with a semiconductor chip mounted thereon when the semiconductor chip is packaged with a resin. In FIG. 1, a rectangular semiconductor chip 1 is mounted on a die pad 3 located substantially at the central portion of a lead frame 8. The die pad 3 is connected to and supported through supporting leads 7 extending to outer frames 2 of the lead frame 8 which are disposed parallel to each other. A plurality of leads 4 are disposed in opposed relation with the semiconductor chip 1 on each of the long sides of the semiconductor chip 1. Each of the leads 4 includes an inner lead 4a disposed in opposed relation with the semiconductor chip 1, and an outer lead 4b extending from the end of the inner lead 4a remote from the semiconductor chip 1. The leads 4 on each of the long sides of the semiconductor chip 1 are connected with each other by a tie bar 5 at the substantially central portions thereof. Unillustrated electrode pads formed on the surface of the semiconductor chip 1 are electrically connected to the corresponding inner leads 4a by wires 6 made of, for example, gold.

Such a lead frame-semiconductor chip assembly is packaged with a resin using a mold 10. As shown in FIG. 2, the mold 10 includes an upper mold half 10a and a lower mold half 10b. The upper and lower mold halves 10a and 10b respectively have rectangular cavity halves 11a and 11b and groove-shaped gate halves 12a and 12b which communicate with the cavity halves 11a and 11b. The portions of the gate halves 12a and 12b, which serve as the entrance to the cavity halves 11a and 11b, form gate ports 13a and 13b having a rectangular cross-section.

Resin packaging will be conducted as follows. First, the semiconductor chip 1 is mounted on the die pad 3 of the lead frame 8, and this leadframe-chip assembly is carried between the upper and lower mold halves 10a and 10b and is located at a predetermined position, as shown in FIG. 1. Thereafter, the upper and lower mold halves 10a and 10b are respectively lowered and raised to sandwich the lead frame 8 therebetween, as shown in FIG. 2. At this time, the upper and lower mold halves 10a and 10b make contact with the outer frames 2 of the lead frame 8, the leads 4 and part of the hanging leads 7. Further, the cavity halves 11a and 11b in combination form a cavity 11 within the mold 10 with the semiconductor chip 1 on the die pad 3 being accommodated therein. Furthermore, the pair of gate halves 12a and 12b form a tubular gate 12, which communicates with the cavity 11 through a gate port 13 formed by the pair of gate port halves 13a and 13b.

Next, a molten thermosetting resin 14 is injected into the cavity 11 through the gate 12 formed in the mold 10 under a predetermined pressure. The resin 14 is divided into two flows by the outer frame 2 of the lead frame 8 which is disposed in such a manner that it separates part of the interior of the gate 12 into upper and lower portions. These portions guide these flows toward the gate port 13 along the upper and lower sides of the outer frame 2. Although a large part of the area within the cavity 11 is separated into upper and lower portions by the die pad 3 having the semiconductor chip 1 mounted thereon, no outer frame 2 exists in the vicinity of the gate port 13, so the resin flows 14 that have passed along the upper and lower sides of the outer frame 2 meet each other near the gate port 13. Thereafter, the resin 14 enters and fills the cavity 11, as shown by the arrows in FIG. 3.

In this state, the thermosetting resin 14 within the cavity 11 is heated to a predetermined temperature to set it. Subsequently, the upper and lower mold halves 10a and 10b are respectively raised and lowered to open the mold 10, and the leadframe-chip assembly is removed from the mold 10. Next, the leadframe-chip assembly is subjected to a subsequent process in which the tie bars 5 are cut and the leads 4 are bent, thereby completing a semiconductor device.

As stated above, although the resin 14 injected toward the cavity 11 is divided into two upper and lower flows by the outer frame 2 within the gate 12, these two flows meet each other in the vicinity of the gate port 13. Thereafter, the resin 14 is again divided into upper and lower flows to be introduced over and under the semiconductor chip 1, respectively. At this time, these new flows are, however, not always uniformly introduced over and under the chip 1. The flows generally have different resistances due to the wires 6 the positions of the semiconductor chip 1 and the die pad 3 in the cavity 11 and so on. In consequence, if the lead frame 8 is not supported so firmly by the leads 7, or if the viscosity of the resin 14 is large, the die pad 3 may be deformed or the semiconductor chip 1 misplaced because of the unbalanced flow pressure of the resin 14, as shown in FIG. 3. This may cause breaks of the wires 6 that connect the electrodes of the semiconductor chip 1 to the inner leads 4a in the resin-packaged semiconductor device. Alternatively, this may make the upper and lower portions of the packaging resin 14 with respect to the semiconductor chip 1 unequal in their thickness, thus leading to the deterioration in the moisture resistance of the semiconductor device.

SUMMARY OF THE INVENTION

The present invention is directed to obviating the aforementioned problems by providing a lead frame by which a semiconductor device having high reliability can be produced. Another object of the present invention is to provide a highly reliable semiconductor device and a manufacturing method thereof.

According to one aspect of the present invention, a lead frame comprises a die pad for mounting thereon a semiconductor chip, the semiconductor chip being provided with a plurality of electrodes, a plurality of leads disposed in opposed relation with the die pad for electrical connection with the plurality of electrodes of the semiconductor chip, outer frame means disposed on the periphery of the die pad for supporting the die pad and the plurality of leads, and resin guide means extending to the vicinity of the die pad from the outer frame means for guiding a molten resin over and under the semiconductor chip during resin packaging.

According to another aspect of the present invention, a semiconductor device comprises a semiconductor chip having electrodes, leads electrically connected to the electrodes of the semiconductor chip, a package body which is formed of a resin injected into a mold for molding the semiconductor chip and part of the leads, and a resin guiding portion buried in the package body for guiding the resin over and under the semiconductor chip in the mold during resin packaging.

According to still another aspect of the present invention, a semiconductor device manufacturing method comprises the steps of mounting a semiconductor chip having electrodes on a substrate means, the substrate means being provided with leads and a resin guiding portion for guiding a resin over and under the semiconductor chip during resin packaging;

electrically connecting the leads on the substrate means to the electrodes of the semiconductor chip;

positioning the semiconductor chip mounted on the substrate means between a pair of mold halves with the semiconductor chip disposed at a corresponding position to cavity halves of the mold halves, the resin guiding portion of the substrate means being aligned with gate halves of the mold halves;

closing the mold halves to sandwich the substrate means between parting surfaces of the mold halves, the resin guiding portion being sandwiched between the gate halves of the mold halves to separate the gate into upper and lower portions, the end of the resin guiding portion protruding into a cavity formed by the cavity halves of the mold halves;

injecting a molten resin into the cavity through the gate, the molten resin passing through the upper and lower portions of the gate and being introduced into the cavity to fill the cavity; and solidifying the resin.

DESCRIPTION OF THE PREFERRED EMBODIMENTS

Embodiments of the present invention will be described below with reference to the accompanying drawings.

Figure 4:
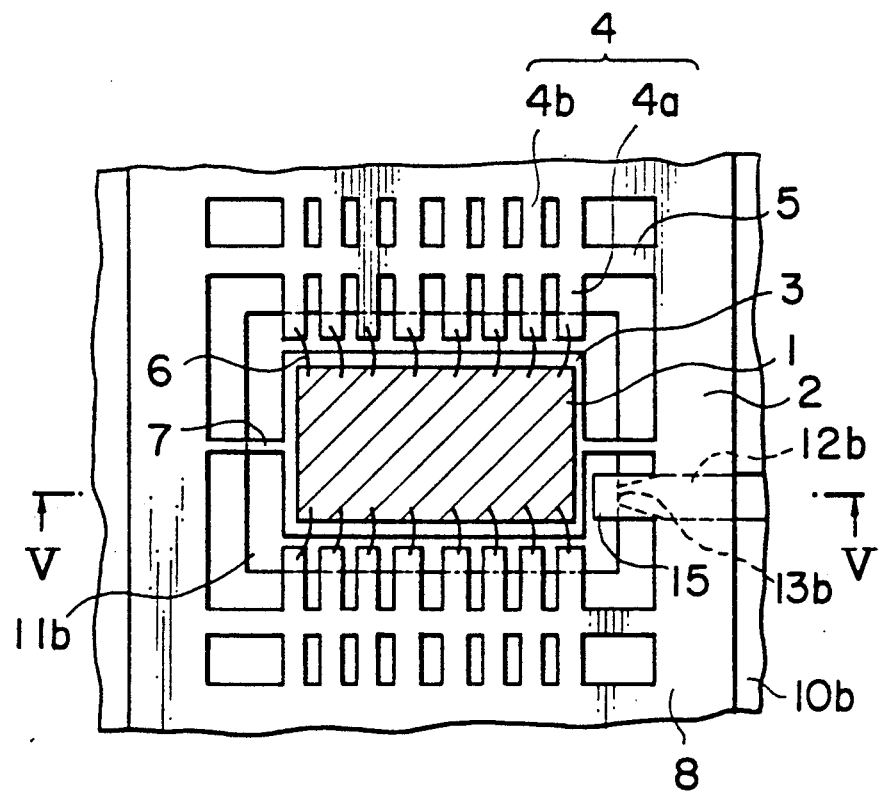
FIG. 4 is a plan view illustrating the relationship between a mold and a lead frame when a semiconductor device of a first embodiment according to the present invention is plastically packaged with a resin.

A first embodiment of the present invention will first be described with reference to FIGS. 4 to 6. In FIG. 4, a rectangular semiconductor chip 1 is mounted on a die pad 3 located substantially at the central portion of a lead frame 8. The die pad 3 is connected to and supported through supporting leads 7 to outer frames 2 of the lead frame 8 which are disposed parallel to each other. A plurality of leads 4 are disposed on each of the long sides of the semiconductor chip 1. Each of the leads 4 includes an inner lead 4a disposed in opposed relation with the semiconductor chip 1, and an outer lead 4b extending from the end of the inner lead 4a remote from the semiconductor chip 1. The leads 4 on each of the long sides of the semiconductor chip 1 are connected with each other by a tie bar 5 at the substantially central portions thereof. Unillustrated electrode pads formed on the surface of the semiconductor chip 1 are electrically connected to the corresponding inner leads 4a by wires 6 made of, for example, gold. Part of one of the outer frames 2 of the lead frame 8 protrudes toward the die pad 3 near the adjacent side edge thereof to form a resin guiding portion 15.

Figure 1:
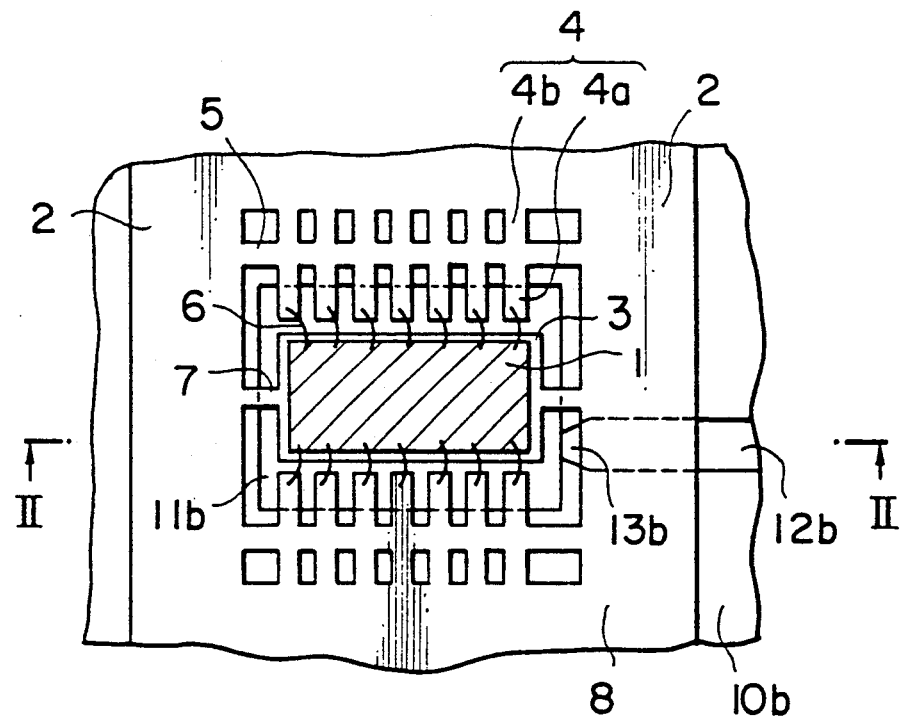
FIG. 1 is a plan view illustrating the relationship between a mold and a lead frame when a conventional semiconductor device is packaged with a resin.
Figure 2:
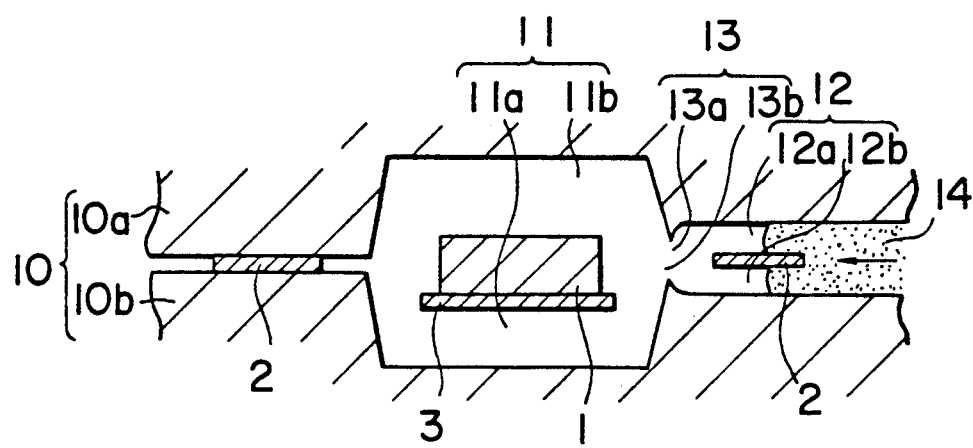
FIGS. 2 and 3 are sections taken along the line II—II of FIG. 1 respectively illustrating resin packaging processes.
Figure 3:
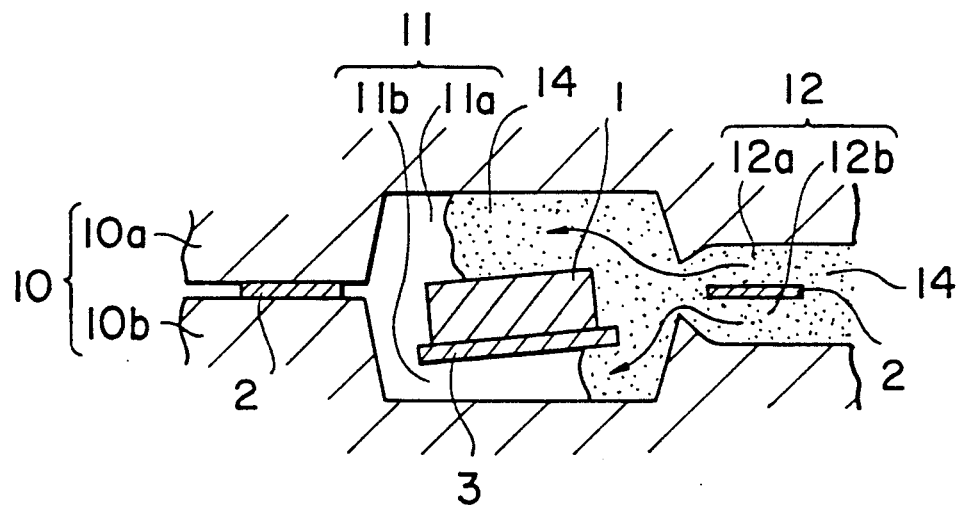

Such a lead frame semiconductor chip assembly is packaged with a resin using a mold 10. The mold 10, like the conventional mold shown in FIGS. 1 to 3, comprises an upper mold half 10a and a lower mold half 10b. The upper and lower mold halves 10a and 10b respectively have rectangular cavity halves 11a and 11b and groove-shaped gate halves 12a and 12b which respectively communicate with the cavity halves 11a and 11b. The portions of the gate halves 12 and 12b which serve as the entrance to the cavity halves 11a and 11b form gate port halves 13a and 13b having a rectangular cross-section. The resin guiding portion 15 is formed to cover the gate port halves 13a, 13b and part of the gate halves 12a, 12b when the leadframe-semiconductor chip assembly is disposed in the mold 10.

Resin packaging will be conducted as follows: First, the semiconductor chip 1 is mounted on the die pad 3 of the lead frame 8, and this lead frame-chip assembly is placed between the upper and lower mold halves 10a and 10b of the opened mold 10 and is located at a predetermined position, as shown in FIG. 4. At this time, the resin guiding portion 15 of the lead frame 8 is located on the gate half 12b and the gate port half 13b of the lower mold half 10b to cover them, with the distal inner end thereof extending into and above the cavity half 11b of the lower mold half 10b.

Figure 5:
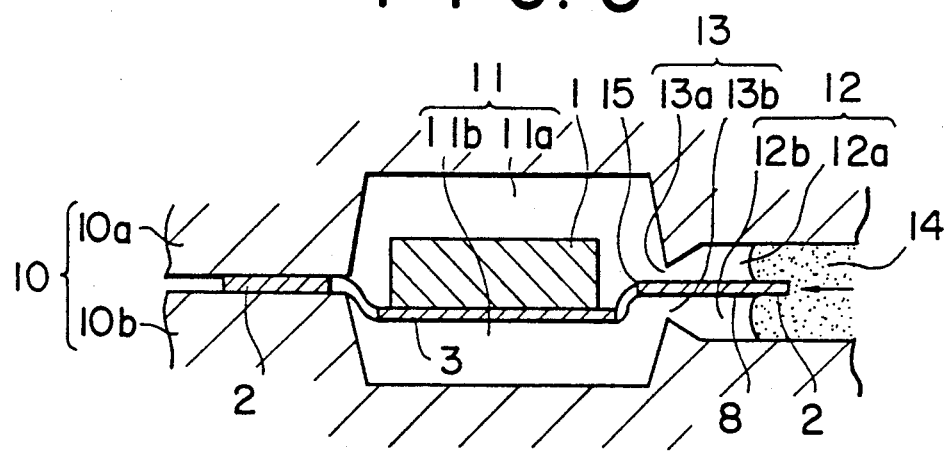
FIG. 5 and 6 are sections taken along the line V—V of FIG. 4 respectively illustrating resin packaging processes.
Figure 6:
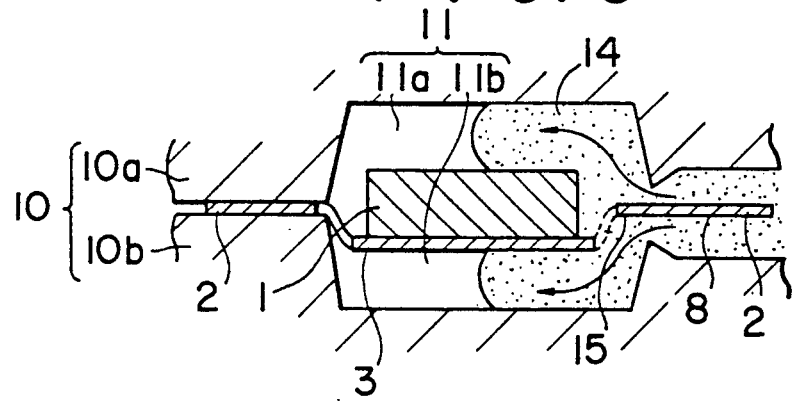

Thereafter, the upper and lower mold halves 10a and 10b are respectively lowered and raised to sandwich the lead frame 8 therebetween, as shown in FIG. 5. At this time, the upper and lower mold halves 10a and 10b make contact with the outer frames 2 of the lead frame 8, the leads 4 and part of the hanging leads 7. Further, the cavity halves 11a and 11b in combination form a cavity 11 within the mold 10 with the semiconductor chip 1 on the die pad 3 being accommodated therein. Furthermore, the pair of gate halves 12a and 12b form a tubular gate 12, which communicates with the cavity 11 through a gate port 13 formed by the pair of gate port halves 13a and 13b. Further, while the distal or inner end of the resin guiding portion 15 of the lead frame 8 is located in the cavity 11, the basal or outer end portion of the resin guiding portion 15 and the outer frame 2 connected therewith extend through part of the gate 12 and the guide port 13, thereby dividing the space in the vicinity of the gate port 13 into upper and lower portions which are substantially completely separated from each other.

Next, a molten thermosetting resin 14 is injected into the cavity 11 through the gate 12 formed in the mold 10 under a predetermined pressure. The injected resin 14 is separated and divided into upper and lower flows at a location halfway between the gate 12 by the outer frame 2 and the resin guiding portion 15 of the lead frame 8, and these two flows then proceed toward the gate port 13. The resin flows which have entered the cavity 11 through the gate port 13 are kept separated by the resin guiding portion 15. One flow of the resin 14 which has passed through the gate half 12a and the gate port half 13a of the upper mold half 10a is introduced into the upper portion of the cavity 11 located above the semiconductor chip 1, while the other flow of the resin 14 which has passed through the gate half 12b and the gate port half 13b of the lower mold half 10b is introduced into the lower portion of the cavity 11 located below the semiconductor chip 1, as shown by the arrows in FIG. 6. The resin guiding portion 15 thus controls the flows of the resin 14 into the cavity 11 so that the resin 14 is substantially uniformly injected into the upper and lower portions of the cavity 11 located over and under the semiconductor chip 1.

Once the cavity 11 has been completely filled with the resin 14, the thermosetting resin 14 within the cavity 11 is heated to a predetermined temperature so that it is caused to set. Subsequently, the upper and lower mold halves 10a and 10b are respectively raised and lowered to open the mold 10, and the lead frame-chip assembly is removed from the mold 10. Next, the lead frame-chip assembly is subjected to a subsequent process in which the tie bars 5, the supporting leads 7 and the resin guiding portion 15 are cut and the leads 4 are then bent, thereby completing a semiconductor device.

As stated above, since such a semiconductor device is formed by uniformly injecting the resin 14 over and under the semiconductor chip 1, misplacement of the semiconductor chip 1 and deformation of the lead frame 8 do not occur during packaging. This reduces the risk that the portions of the packaging resin 14 respectively located over and under the semiconductor chip 1 will have unequal thicknesses or that the wires 6 will break, thereby providing a highly reliable semiconductor device.

In this embodiment, although the resin guiding portion 15 of the lead frame 8 which separates part of the gate 12 and the gate port 13 of the mold 10 into upper and lower portions has a width larger than that of the gate 12 as viewed from above, it may have other shapes besides the rectangular form shown in FIG. 4.

Figure 7:
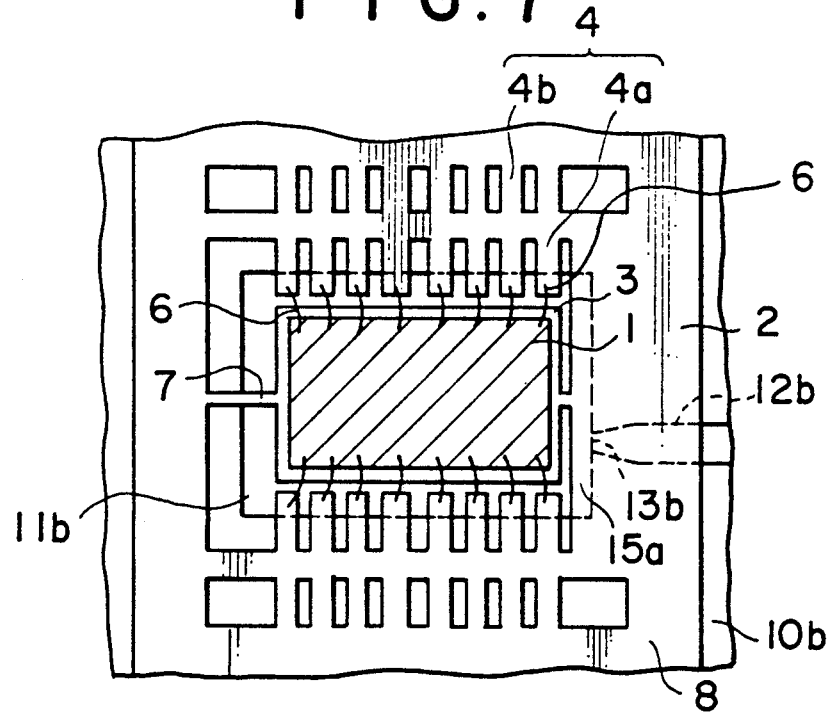
FIG. 7 is a plan view illustrating the relationship between a mold and a lead frame produced when a semiconductor device of a second embodiment according to the present invention is packaged with a resin.

Further, as shown in FIG. 7, the portion of the outer frame 2 of the lead frame 8 which is located above the gate half 12b of the lower mold half 10b may be widened toward the die pad 3 so that it extends above the cavity half 11b of the lower mold half 10b to form a wide or enlarged resin guiding portion 15a. In this case, since a larger part of the cavity 11 of the mold 10 is separated into upper and lower portions by the wide or enlarged resin guiding portion 15a, more accurate control of the resin flow 14 can be ensured during the resin packaging.

Figure 8:
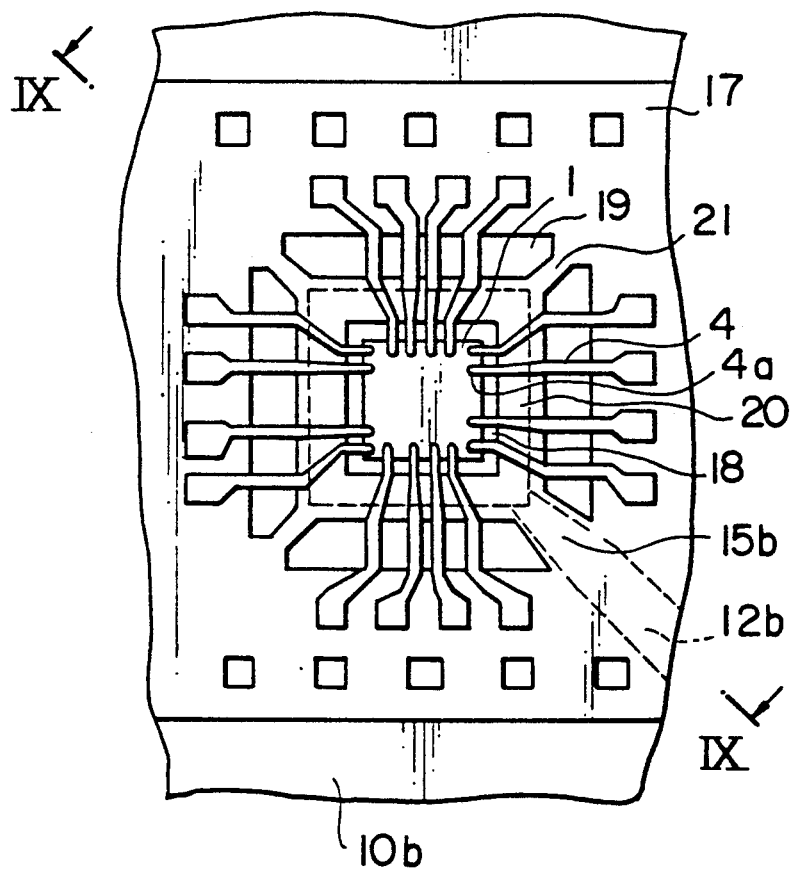
FIG. 8 is a plan view illustrating the relationship between a mold and a lead frame produced when a semiconductor device of a third embodiment according to the present invention is packaged with a resin.

FIG. 8 is a plan view showing a semiconductor device of a third embodiment of the present invention. In this semiconductor device, electrodes of a semiconductor chip 1 are formed as bump electrodes, which are electrically connected directly to inner leads 4a of leads 4 formed on a flexible insulating film 17 made of, for example, a polyimide. The central portion of the film 17 includes a rectangular opening 18 in which the semiconductor chip 1 is accommodated. The film 17 also has a plurality of outer lead holes 19 around the opening 18. The leads 4 are supported by supporting portions 20 which are provided between the opening 18 and the outer lead holes 19. The supporting portions 20 are secured to the film 17 through bridging portions 21 each of which is located between the mutually adjacent ones of the outer lead holes 19.

The gate half 12b of the lower mold half 10b is formed such that it is located below one of the bridging portions 21 of the film 17 when the film 17 is mounted thereon. The bridging portion 21 located above the gate half 12b and the supporting portion 20 that continues from this bridging portion 21 in combination form a resin guiding portion 15b of this embodiment.

Figure 9:
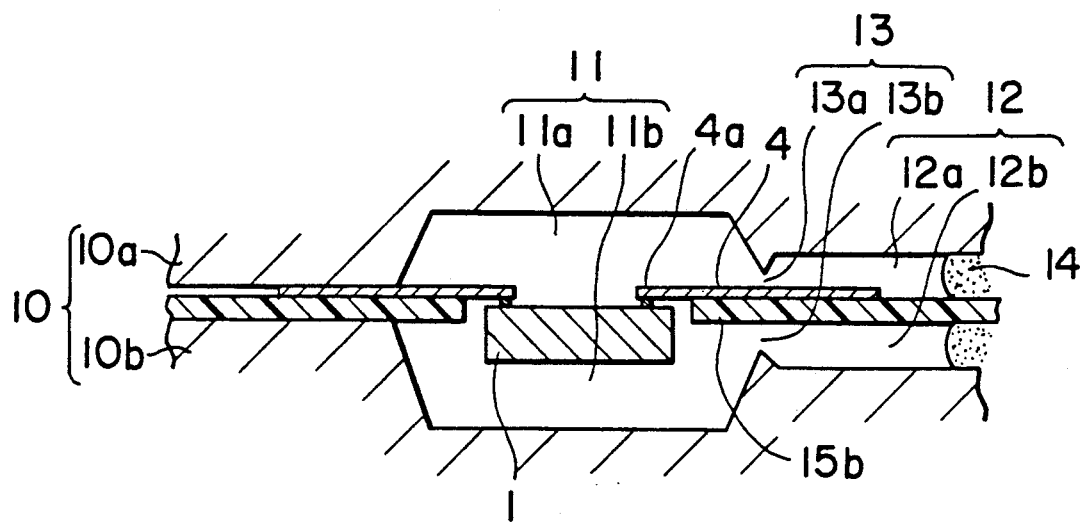
FIG. 9 is section taken along the line IX—IX of FIG. 8 illustrating the resin packaging process.

When the film-chip assembly is to be packaged, the assembly is placed between the upper and lower mold halves 10a and 10b of the mold 10, as shown in FIG. 9, and the resin 14 is injected into the cavity 11 through the gate 12 formed by the gate halves 12a and 12b of the upper and lower mold halves 10a and 10b.

At this time, the resin 14 is separated into upper and lower flows within the gate 12 of the mold 10 by the resin guiding portion 15b, and these flows are respectively introduced into the cavity 11 through the gate 12 of the mold 10. In consequence, the resin 14 is injected over and under the semiconductor chip 1 uniformly, making it possible to fabricate a highly reliable semiconductor device.

Any of the above-described embodiments employs the mold 10 in which the gate port halves 13a and 13b of the upper and lower mold halves 10a and 10b form the gate port 13 having a rectangular cross-section and in which this gate port 13 is separated into upper and lower portions by the resin guiding portion 15. However, the gate port 13 may have any suitable cross-section, shape or size, so long as it allows the resin 14 to be uniformly introduced into the upper and lower portions of the cavity 11.

What is claimed is:

1. A lead frame comprising:
a die pad having opposed first and second sides defining a thickness direction perpendicular thereto, said first side for mounting thereon a semiconductor chip including a plurality of electrodes;
a plurality of leads disposed peripherally around said die pad for electrical connection with respective electrodes of the semiconductor chip; and
an outer frame member peripherally disposed around said die pad from which said plurality of leads extend including supporting leads extending to and supporting said die pad and resin guide means extending toward said die pad from said outer frame member for disposition (i) within a molding cavity of a mold that receives said die pad, (ii) centrally disposed, relative to the thickness direction, within a resin gate groove of the mold through which molten resin is supplied to the molding cavity, said gate groove having a height generally parallel to the thickness direction and a width transverse to the thickness direction, and (iii) extending fully across the width of the gate groove for dividing the molten resin into two separated streams in the gate groove and for guiding the two streams of molten resin flowing through the gate groove along the resin guiding means respectively to said first and second sides of said die pad and to the semiconductor chip during resin encapsulation of said lead frame and the semiconductor chip without intermixing of the two streams in the gate groove and adjacent the gate groove in the molding cavity.

2. A resin packaged semiconductor device comprising:
   a die pad having opposed first and second sides defining a thickness direction perpendicular thereto;
   a semiconductor chip including a plurality of electrodes, said chip being mounted on the first side of said die pad;
   a plurality of leads electrically connected to respective electrodes of said semiconductor chip; and
   a molden resin encapsulating said semiconductor chip, part of said leads, and a portion of resin guiding means that was disposed within a molding cavity of a mold that received said die pad during resin encapsulation, that was centrally disposed, relative to the thickness direction, within a resin gate groove of the mold through which molten resin has been supplied to the molding cavity for forming the molded resin, said gate groove having a height generally parallel to the thickness direction and a width transverse to the thickness direction and extending fully across the width of the gate groove for dividing the molten resin into two separated streams in the gate groove and for guiding the two streams of molten resin flowing through the gate groove along the resin guiding means respectively to said first and second sides of said die pad and to the semiconductor chip during formation of said molded resin without intermixing of the two streams in the gate groove and adjacent the gate groove in the molding cavity.

* * * * *